United States Patent [19]

Suzuki et al.

[11] 4,261,660
[45] Apr. 14, 1981

[54] SURFACE POTENTIOMETER FOR USE IN AN ELECTROSTATIC COPIER

[75] Inventors: Koji Suzuki, Yokohama; Hajime Katayama, Kawasaki; Noriyoshi Iida, Ichikawa, all of Japan

[73] Assignee: Canon Kabushiki Kaisha, Tokyo, Japan

[21] Appl. No.: 956,330

[22] Filed: Oct. 31, 1978

[30] Foreign Application Priority Data

Nov. 9, 1977 [JP] Japan ................. 52/133594

[51] Int. Cl.³ .................. G03G 15/00
[52] U.S. Cl. .................. 355/14 R; 324/455; 324/457
[58] Field of Search ............ 324/452, 455, 457, 458; 355/3 R, 3 CH, 14 R

[56] References Cited

U.S. PATENT DOCUMENTS

| | | | |
|---|---|---|---|
| 3,013,203 | 12/1961 | Allen et al. | 324/455 |
| 3,321,307 | 5/1967 | Urbach | 324/458 X |
| 3,525,936 | 8/1970 | Vosteen | 324/458 X |
| 3,667,036 | 5/1972 | Seachman | 324/455 X |
| 3,898,001 | 8/1975 | Hardenbrook et al. | 355/3 R |
| 4,127,806 | 11/1978 | Shuey et al. | 324/452 |

Primary Examiner—Fred L. Braun
Attorney, Agent, or Firm—Fitzpatrick, Cella, Harper & Scinto

[57] ABSTRACT

A surface potentiometer has a conductive shield housing provided in proximity to a body to be measured, a cage-shaped chopper rotatable within the housing, and an electrode disposed further inwardly of the chopper. The chopper is rotated to induce in the electrode a voltage corresponding to the potential of the body to be measured, thereby measuring the surface potential of the body to be measured.

14 Claims, 18 Drawing Figures

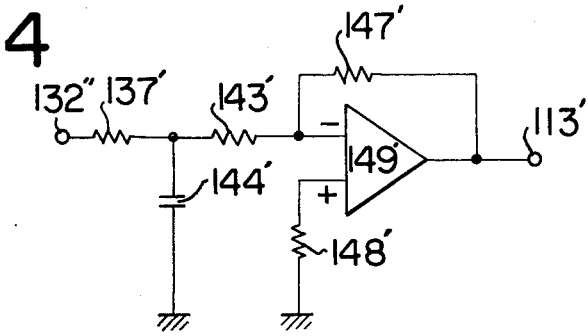
FIG.14
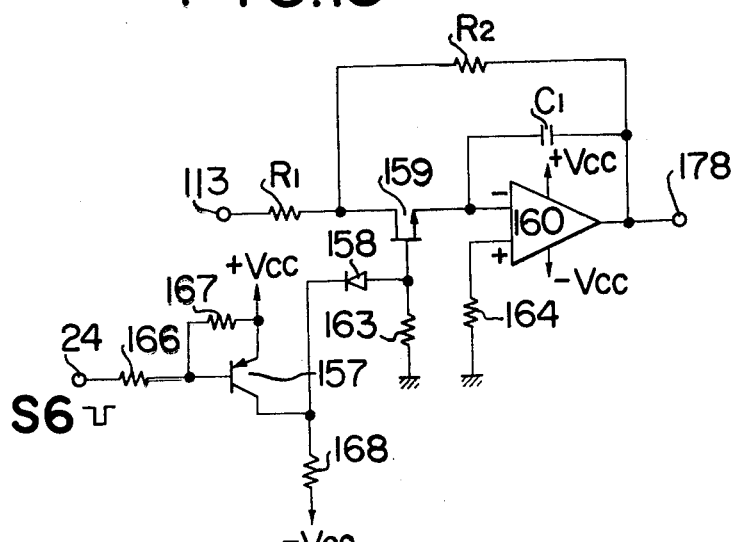
FIG.15
FIG.16
S4 
S6 
S7 

SURFACE POTENTIOMETER FOR USE IN AN ELECTROSTATIC COPIER

BACKGROUND OF THE INVENTION

1. Field of the Invention

This invention relates to a surface potentiometer for measuring the surface potential of a conductor or an insulator in non-contact fashion. Particularly, it relates to a surface potentiometer suited for the measurement of the latent image potential on a photosensitive drum in an electrophotographic copying machine.

2. Description of the Prior Art

As a potentiometer of this non-contact type, there is a system of vibrating an electrode opposed to a surface to be measured and converting the potential into an AC signal, thereby measuring the potential of the surface to be measured, but such system must also employ a zero calibration system to provide a stable output and thus it is very much complicated in construction and in the arrangement of the detecting circuit. There is also a system whereby a chopper blade having a predetermined potential applied thereto is rotated between the surface to be measured and the measuring electrode to convert the potential into an AC signal, but this system has suffered from disadvantages such as production of great noise and difficulty with which the device is made compact.

SUMMARY OF THE INVENTION

It is an object of the present invention to provide a mechanical chopper type surface potentiometer which eliminates the disadvantages peculiar to the prior art.

More particularly, it is an object of the present invention to provide a surface potentiometer which minimizes the noise and can be made compact by rotating a cage-shaped chopper within a shield housing.

The invention will become more fully apparent from the following detailed description thereof taken in conjunction with the accompanying drawings.

BRIEF DESCRIPTION OF THE DRAWINGS

FIG. 14 is a diagram of the integrating circuit according to another embodiment.

FIG. 15 shows the sampling circuit.

FIG. 16 illustrates signal waveforms at various parts of FIG. 15.

DESCRIPTION OF THE PREFERRED EMBODIMENTS

Figure 1:
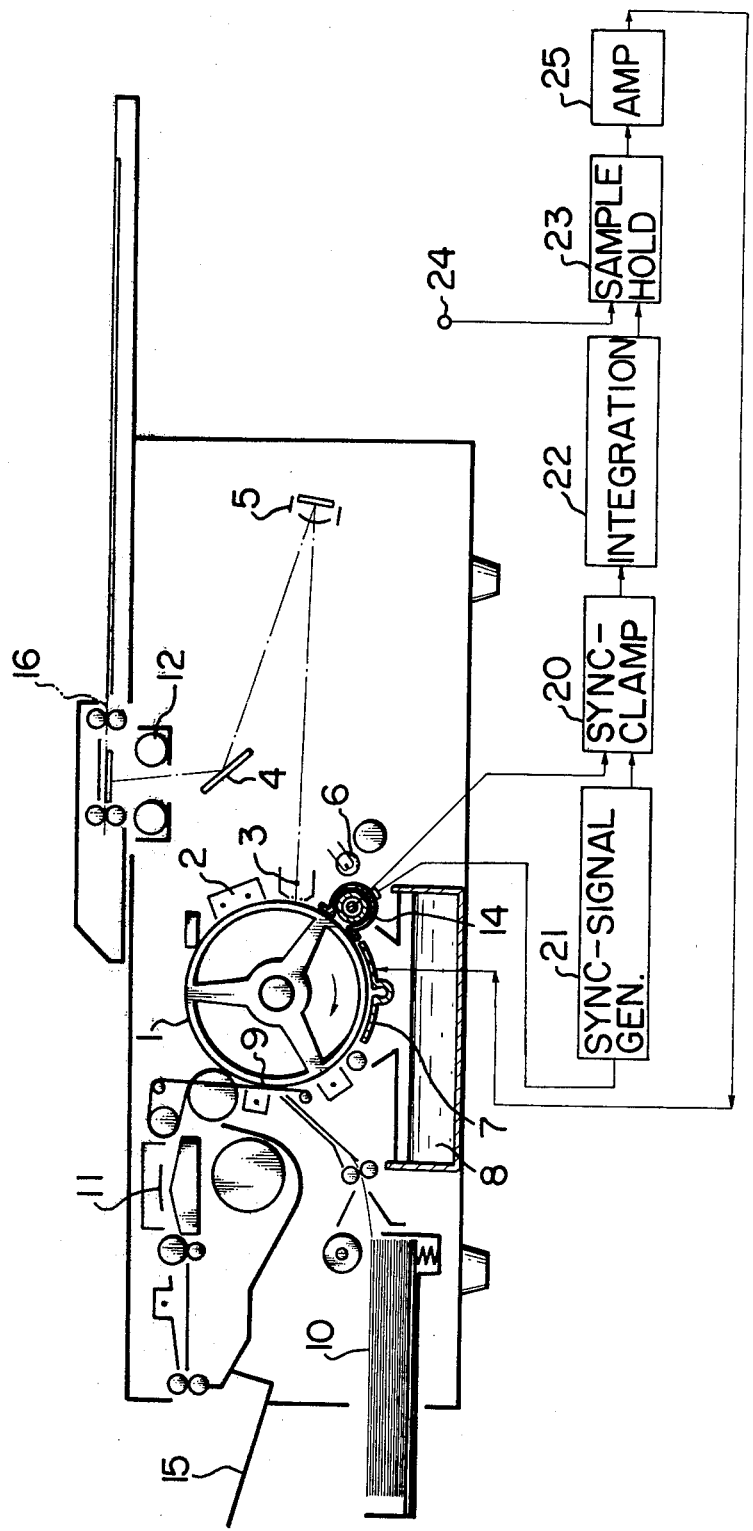
FIG. 1 is a schematic view of an electrophotographic copying machine provided with the surface potentiometer of the present invention.

Referring to FIG. 1, it shows an application of the potentiometer of the present invention and signal processing circuit to an electrophotographic copying machine. Designated by 1 is a photosensitive drum comprising a conductive cylinder and two very thin photosensitive and insulating layers formed over the surface of the conductive cylinder. The photosensitive drum 1 is rotatable in the direction of arrow. The photosensitive drum is uniformly charged over the surface thereof by corona discharge from a primary charger 2, and then subjected to AC corona discharge from an AC charger 3 and light from an original 16 illuminated by a lamp 12 through an optical system 4, 5, simultaneously, to discharge the surface portion illuminated by the light, whereafter the surface of the photosensitive drum is uniformly illuminated by a whole surface exposure lamp 6 to reduce the resistance value of the photosensitive layer and thereby form a potential contrast, namely, a latent image on the drum surface. The latent image is dipped in deveoping liquid 8 within a developing dish 7 to cause toner having a charge opposite in polarity to the latent image in the developing liquid to be deposited on the drum surface, thus completing the developing step. The developed image is transferred to copy paper 10 at an image transfer station 9, and heated and fixed by a fixing device 11 and the copy paper is discharged into a tray 15.

The potentiometer 14 of the present invention is mounted between the whole surface exposure lamp 6 and the developing device 7 and adjacent to the drum 1 (at a distance of 1 to 10 mm from the drum) to measure the latent image potential before developing. The output of the potentiometer 14 is converted into a DC signal at a synchronizing clamp circit 20 by a synchronizing signal generated from a synchronizing signal generating circuit 21, and is integrated by an integrating circuit 22 and applied to a sample hold circuit 23.

The sample hold circuit 23 extracts and holds the amplitude component of the output of the integrating circuit 22 by a predetermined timing signal applied to a terminal 24. The held output is amplified by an amplifier 25, whereafter it is applied to the developing dish 7 and the potential difference between the photosensitive drum 1 and the developing dish 7 is controlled so as to be constant such that development suited for the latent image potential is effected.

Figure 2:
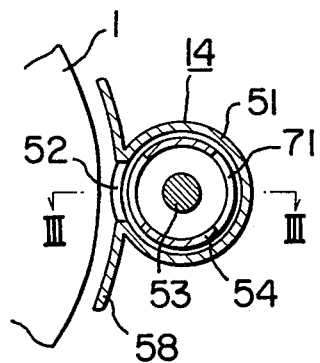
FIG. 2 is a cross-sectional side view of the surface potentiometer of the present invention.
Figure 3:
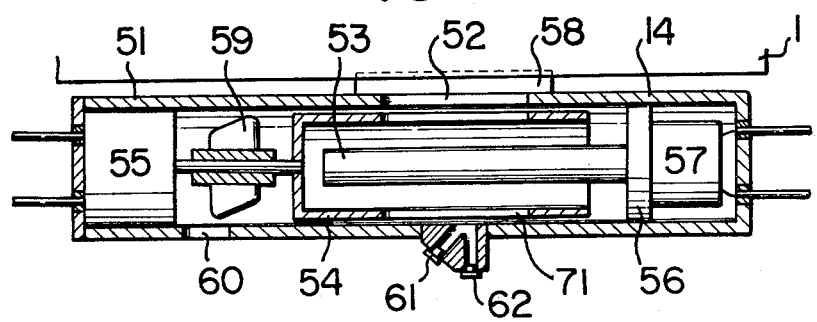
FIG. 3 is a longitudinal cross-sectional view taken along line II—II in FIG. 2.

FIGS. 2 and 3 specifically illustrate the surface potentiometer 14 of the present invention. Designated by 51 is a conductive shield cylinder having a long window 52 formed along the bus line thereof. The shield cylinder 51 is mounted parallel to the drum with the window 52 thereof opposed to the photosensitive drum 1 so as to direct the electric line of force of the latent image potential to an internal measuring electrode 53. The shield cylinder 51 is biased to a predetermined potential to thereby eliminate the influence of the external electric field other than the latent image as much as possible.

Designated by 54 is a conductive, rotatable cage chopper disposed between the shield cylinder 51 and an electrode 53 and parallel thereto and concentrically therewith. The rotatable chopper is formed with a plurality of equidistant windows 71 which are substantially similar in shape to the window 52 of the shield cylinder 51. The chopper is rotatively driven at high speed by a motor 55 incorporated in one end portion of the shield cylinder 51 and intermittently converts into an AC signal the electric field provided by the latent image potential on the photosensitive drum 1, at a predetermined period, and imparts the AC signal to the measuring electrode 53. The AC signal induced in the measuring electrode must be of AC frequency of at least 100 Hz, because, if it is below 100 Hz, it is subjected to the influence of low frequency noise and unstable to prevent accurate measurement. In the present embodiment, the motor is rotated at a constant speed so that the AC frequency is 300 Hz. The cage chopper 54 is biased to the same potential as the shield cylinder 51, for example, through the rotary shaft thereof. If conduction is not obtained from the rotary shaft, conduction is effected to the shield cylinder 51 by slip ring or other means.

The measuring electrode 53 is a conductive circular cylinder and is secured on the center axis of the shield cylinder 51 by means of an insulating plate 56 of a highly insulative material such as tetrafluoroethylene or the like. Directly connected to the measuring electrode 53 is the input terminal of an amplifier 57 (to be described) incorporated in the other end of the shield cylinder 51, and the signal of very high impedance induced in the measuring electrode 53 is converted into a low impedance signal by an amplifier 57 and drawn out of the shield cylinder 51, so that measurement with a high signal-to-noise ratio becomes possible without the attenuation by the cable and without mixing of extraneous noise.

Designated by 58 in FIG. 3 is a conductive shield plate secured to the outside of the window 52 to increase the signal-to-noise ratio. It serves to shield the field outside the drum 1, for example, the noise field based on an AC charger provided adjacent to the potentiometer.

With the potentiometer of the present invention, a blower blade 59 is mounted on a motor shaft between the motor 55 and the cage chopper 54 to prevent entry of toner or dust into the interior and clean air is taken in through an intake port 60 provided in the shield cylinder 51 and exhausted through the window 52, thus preventing an increased rotational load resulting from deposition of dust onto the rotary bearing portion, deteriorated insulating resistance between the measuring electrode and the shield cylinder resulting from deposition of dust, and variation in the measuring potential due to deposition of charged dust on the measuring electrode 53, thereby enabling stable measurement of the latent image potential.

As the means for detecting the field interrupting time of the cage chopper, the arrangement shown in FIG. 3 includes a photocoupler mounted on the shield cylinder 51, the photocoupler comprising a combination of a light-emitting diode 61 and a phototransistor 62, and the light emitted from the light-emitting diode 61 is reflected by the conductive portion of the cage chopper 54 and received by the phototransistor 62 so that the interrupting time detection output is obtained across the phototransistor 62.

Figure 4:
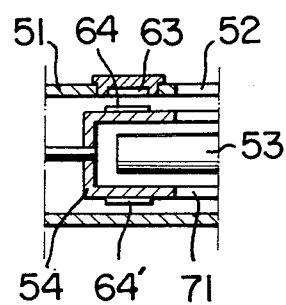
FIG. 4 is a front view of a portion of the surface potentiometer of the present invention and showing an example of the phase detector means.

FIG. 4 shows an arrangement in which interrupting time detector means comprising a magnetic coupling is provided by attaching a Hall element 63 to the shield cylinder 51 and by attaching a magnet 64 to the cage chopper 54. When the magnetic field of the magnet 64 acts on the Hall element 63, interrupting time detection output is obtained across the magnet 64. Designated by 64' is a magnet disposed at a symmetric position with the magnet 64 to balance the rotation of the chopper 54, and the poles of the magnet 64' are disposed oppositely to those of the magnet 64 so that the magnet 64' does not affect the output of the Hall element 63 even if it approaches the Hall element 63.

Figure 5:
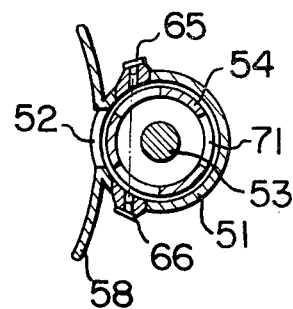
FIG. 5 is a cross-sectional view of the surface potentiometer of the present invention and showing another example of the phase detector means.

FIG. 5 shows photoelectric element interrupting time detector means provided by a light-emitting diode 65 and a phototransistor 66 oppositely attached to the shield cylinder 51. The light emitted from the light-emitting diode 65 passes through the window 71 of the cage chopper 54 and is received by the phototransistor 66 so that interrupting time detection output is obtained across the phototransistor 66.

Figure 6:
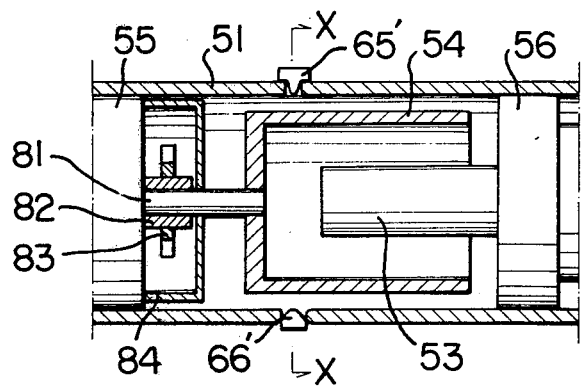
FIG. 6 is a side sectional view of the surface potentiometer according to another embodiment of the present invention.
Figure 7:
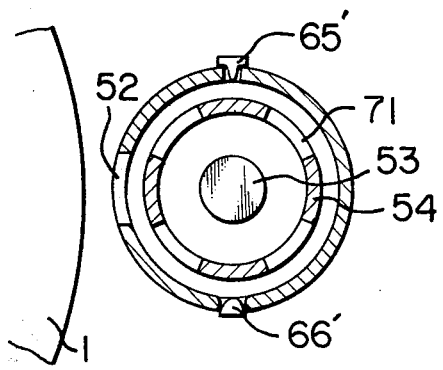
FIG. 7 is a sectional view taken along line X—X' in FIG. 6.
Figure 8:
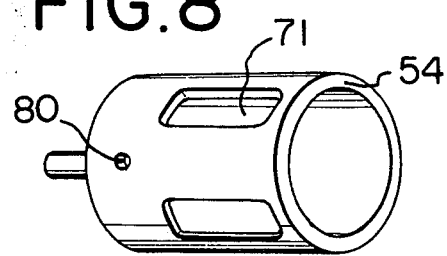
FIG. 8 is a perspective view of a chopper.

In FIG. 5, the light from the light-emitting diode 65 is received by the phototransistor 66 through the window of the chopper 54, whereas in the embodiments of FIGS. 6, 7 and 8, there are provided light-emitting diode light transmitting windows 80 for transmitting therethrough the light from the light-emitting diode.

Four equidistant potential measuring windows are provided on the chopper 54 and four equidistant light-emitting diode light transmitting windows 80 are provided intermediately of the potential measuring windows 71. The signal induced in the electrode 53 is an AC voltage because the chopper is rotated to interrupt the clearance between the drum surface and the electrode 53 at equal intervals, and the signal is transmitted to the synchronizing clamp circuit 20 to be described. The light from the light-emitting diode 65' is received by a phototransistor 66' when the chopper 54 interrupts the clearance between the drum 1 surface and the electrode 53, and a synchronizing signal is generated at that time.

Also, the measurement signal induced in the measuring electrode 53 is of a very high impedance and so, the measuring electrode 53 is apt to pick up extraneous noise. Therefore, when the potential of the chopper 54 is varied, the influence thereof presents itself greatly in the measurement signal, but in the present embodiment, it is possible to stably control the potential of the chopper because a slip ring 82 and an earthing brush 83 are mounted on the rotary shaft 81 of the motor 55 and the potential of the rotary shaft 81 is grounded through the hermetically sealing housing 84 of the motor, the motor jacket and the shield cylinder 51. Also, in the present embodiment, the earthing brush 82 is provided in the hermetically sealing housing 84 of the motor 55 side.

By so constructing, it is possible to prevent the dust such as toner chiefly composed of carbon in the copying machine from staining the brush 82 and creating electrical noise.

Also, the cage-like configuration of the chopper leads to compactness of the potentiometer, as compared with the potentiometer using a rotatable wing type chopper. In the present embodiment, the diameter of the shield cylinder may be 12 mm, the diameter of the chopper may be 8 mm and the diameter of the electrode may be 6 mm.

Figure 9:
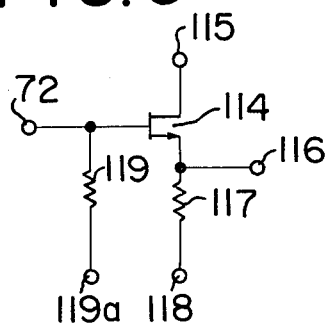
FIG. 9 is a circuit diagram of the impedance conversion amplifier.
Figure 10:
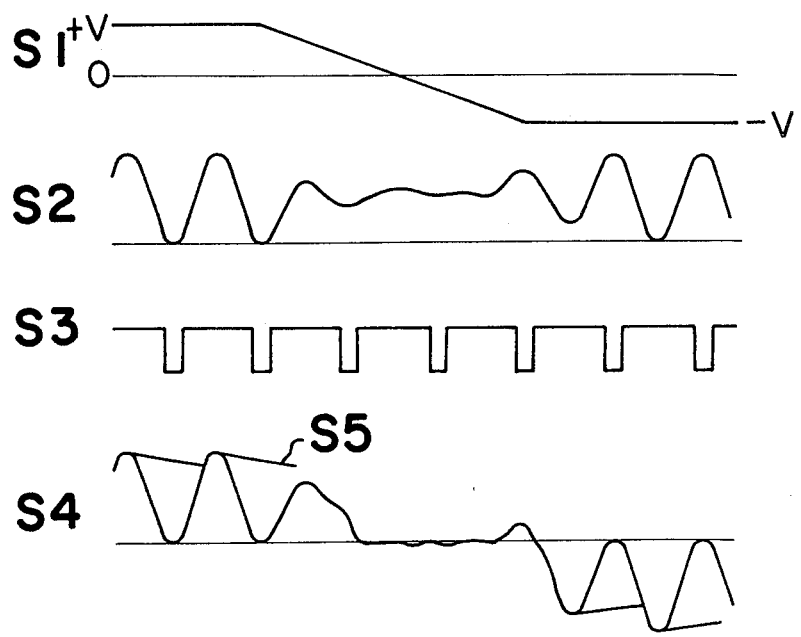
FIG. 10 illustrates signal waveforms.

FIG. 9 is a circuit diagram showing an example of the aforementioned amplifier 57 for effecting the impedance conversion incorporated in the shield cylinder 51. The input terminal 72 thereof, namely, the gate of a field effect transistor (hereinafter referred to as FET) 114 and one end of a bias resistor 119 are directly connected to the measuring electrodes 53 and 255. Terminal 115 is connected to a positive power source and terminal 118 is connected to a negative power source. Terminal 119a is connected to the same potential as the shield cylinders 51 and 251, in the shown example, to a zero potential. The bias resistor 119 may be of a high resistor value greater than 100 MΩ and a resistor 117 may be of a low resistance value of about 1 KΩ. The AC signal based on the latent image potential induced in the measuring electrodes 53, 255 (the surface potential of the measured surface, S1 in FIG. 10) is converted into a signal of low impedance (S2 in FIG. 10) by the FET 114 and put out at terminal 116.

Figure 11:
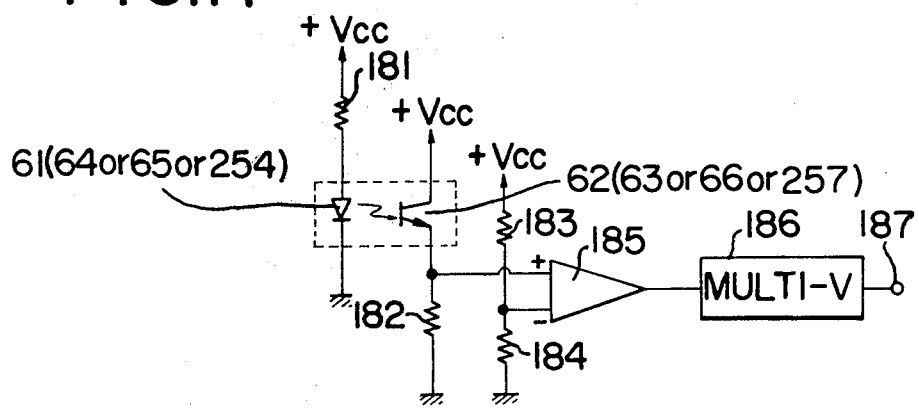
FIG. 11 is a diagram of the synchronizing signal generating circuit.

FIG. 11 shows an example of the synchronizing signal generating circuit 21. When the light from the light-emitting diodes 61, 254 impinges on phototransistors 62, 257, a photocurrent flows to a resistor 182 to invert a comparator circuit 185 and the resulting positive pulse is converted into a negative synchronizing signal of narrow width by a monostable circuit 186.

Figure 12:
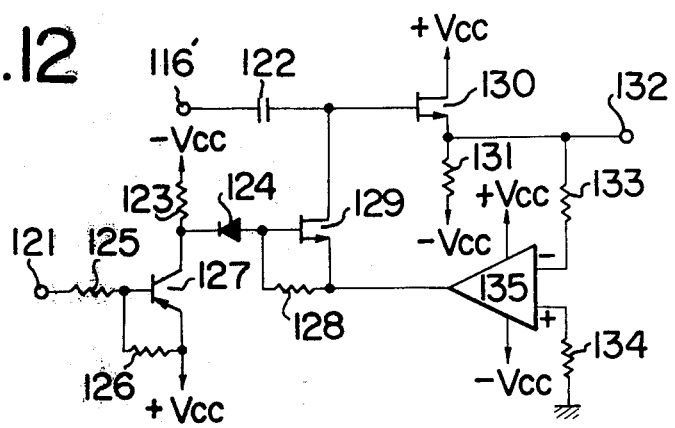
FIG. 12 shows the synchronizing clamp circuit.

FIG. 12 shows an example of the synchronizing clamp circuit 20. The output of the amplifier 57 (S2 in FIG. 10) is applied to one input terminal 116′ and a synchronizing signal (S3 in FIG. 10) is applied to the other input terminal 121. In this case, the synchronizing signal S3 is obtained when the choppers 54 and 253 cover the measuring electrodes 53 and 255 with a maximum area, so that as shown in FIG. 7, when the surface potential S1 of the measured surface is positive, the synchronizing signal is applied in synchronism with the minimum point of the output S2 and When the surface potential S1 is negative, the synchronizing signal is applied in synchronism with the maximum point of the output S2.

When the synchronizing signal is applied, the transistor 127 conducts, the diode 124 is rendered non-conductive and the FET 129 conducts with its gate-source being zero potential. Therefore, the negative input side and output side of a differential amplifier 135 become connected through FET 129, FET 130 and resistor 133 and all the feedback is exerted thereon. The input impedance and gain of the differential amplifier 135 are so great and the potential difference on the input side thereof is so small that the output terminal 132 is clamped to zero potential.

If the input impedance of the electronic circuit connected to the output terminal 132 and the interruption resistance of FET 129 are sufficiently great, the charge stored in a capacitor 122 is not discharged when the synchronizing signal S3 has become exhausted and FET 129 has become non-conductive, so that the input signal S2 is shifted (only the DC level is varied with the amplitude of the signal constant) by an amount corresponding to the terminal voltage of the capacitor 122 and there is obtained on the output terminal 132 a DC reproduction (the DC reproduction means conversion into a DC signal of a surface potential S1 once converted into an AC signal). In this case, FET 130 serves to draw out the junction between the capacitor 122 and the FET 129 to the terminal 132 at a low impedance.

Figure 13:
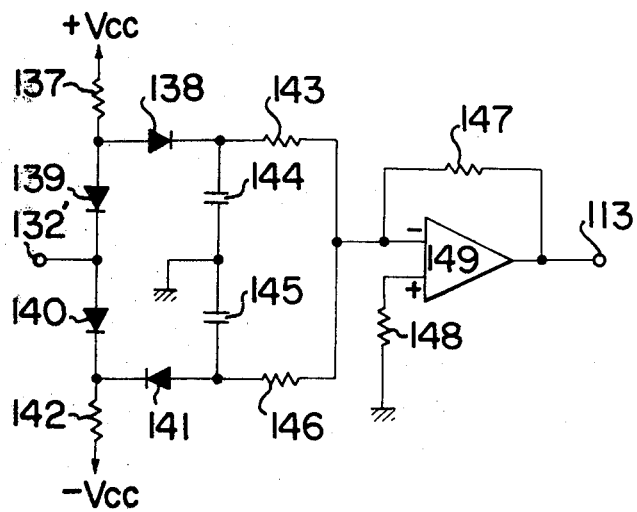
FIG. 13 shows the integrating circuit.

The positive or negative surface potential of the surface to be measured may be measured from the positive or negative of the so obtained DC reproduction output. In this case, to remove and smooth noise of high frequency component included in the DC reproduction output S4, the DC reproduction output S4 is applied as input to the input terminal 132′ of an integrating circuit 22 and the positive and the negative of the output S4 are rectified by diodes 138 and 141, respectively, and smoothed by capacitors 144 and 145, whereafter the sum thereof is taken at an operational amplifier 149 so that a smoothed DC output S5 of the DC reproduction output S4 may be provided at the output terminal 113. In FIG. 13, reference characters 139 and 140 designate diodes for correcting the forward voltages of diodes 138 and 141, and reference characters 143 and 146 designate rectifier resistors.

FIG. 14 shows another embodiment of the integrating circuit 22 in which integration is effected by a resistor 137′ and a capacitor 144′ and amplification is effected by an operational amplifier 149′.

The aforementioned DC output S4 has its amplitude component extracted and held at the sample hold circuit 23 by a predetermined timing signal (S6 in FIG. 16) applied to the terminal 24 (See S7 in FIG. 16).

FIG. 15 shows an example of the sample hold circuit 23. When a timing signal S6 of narrow width enters an input terminal 24, a transistor 157 becomes conductive, a diode 158 becomes non-conductive and FET 159 becomes conductive. Upon the conduction of the FET 159, an inverted signal of a magnitude of $R_2/R_1$ of the DC output S5 applied to a terminal 113′ appears at the output terminal 178. At this time, the negative input of a differential amplifier 160 assumes zero potential to permit a capacitor C1 to be charged with a charge based on the output voltage. When the timing signal S6 becomes exhausted, the FET 159 is rendered non-conductive and since the input impedance of the differential amplifier 160 is very great, the charge stored in the capacitor C1 is not discharged and the output voltage remains held.

Figure 17:
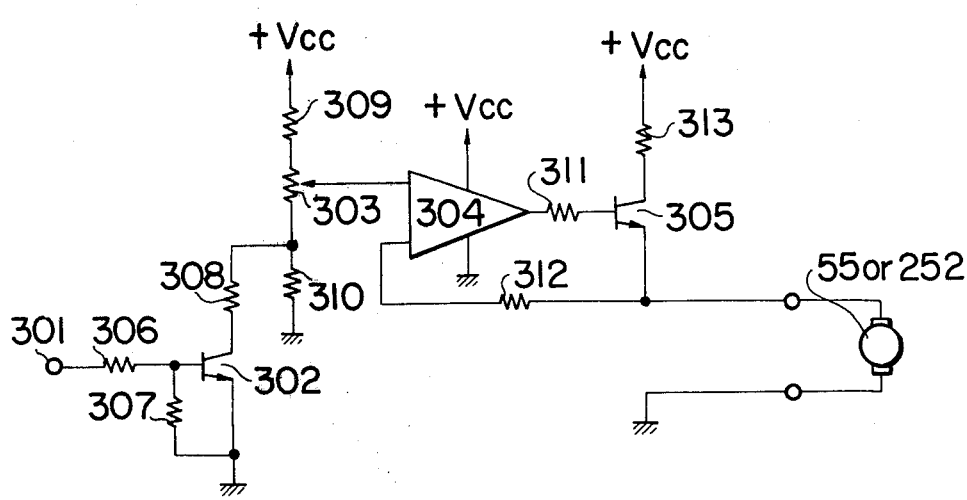
FIG. 17 is a diagram of the motor driving circuit.
Figure 18:
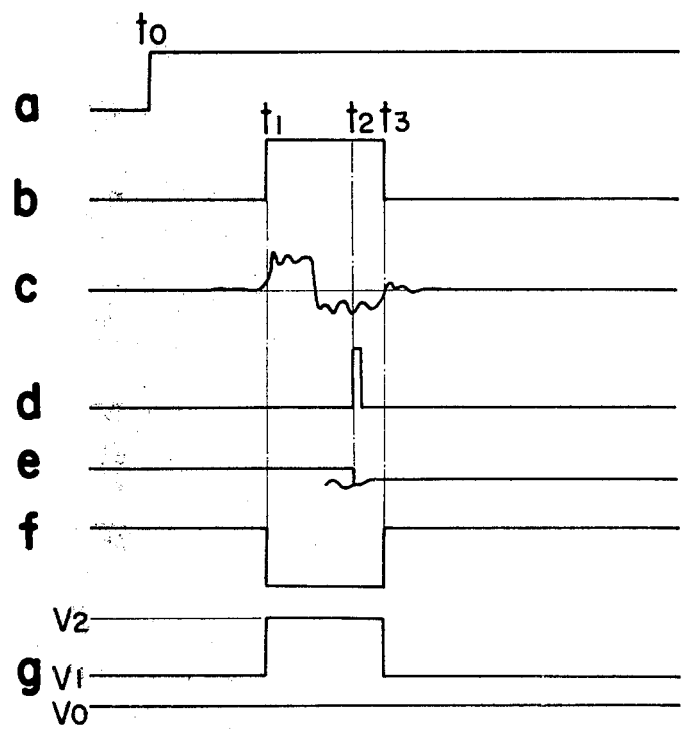
FIGS. 18a-g illustrates the drive timing.

FIG. 17 shows an example of the driving circuit of the motors 55 and 252 for rotating the cage choppers 54 and 253, and FIG. 18 illustrates the drive timing thereof. Designated by ⓐ is a set signal for the entire copying machine. At the timing $t_0$, copy instruction is given and the copying machine enters into its set condition. Designated by ⓑ is a photosensitive drum pre-rotation control signal for cleaning the photosensitive drum 1 and for detecting the latent image potential. At the timing period ($t_1$–$t_3$), a predetermined standard quantity of light is imparted to the photosensitive drum 1. Designated by ⓒ is the output of the potentiometer 14 taken out through the synchronizing clamp circuit of FIG. 12.

At the predetermined timing $t_2$ during the pre-rotation, a timing signal ⓓ is imparted to the sample hold circuit 23 (FIG. 15) to hold the amplitude component of the output of the potentiometer 14 as shown by ⓔ.

The inverted signal ⓕ of the pre-rotation control signal ⓑ is applied to the input terminal of the motor drive circuit, and at the timing ($t_1$–$t_3$), a transistor 302 becomes non-conductive, and a high voltage $V_2$ set by a number-of-revolution setting volume 303 is applied to the motors 55 and 252 to effect rapid revolution of the motors. When the pre-rotation comes to an end, the transistor 303 conducts to apply a low voltage $V_1$ to the motors 55 and 252 to permit them to continue revolution at low speeds.

Thus, the rapid revolution of the motor necessary for the measurement is effected for the very short time of measurement, so that the number of revolutions may be increased with the life of the motor neglected and the rapid revolution enables the elimination of low frequency noise, rapid measurement and measurement of high resolution. By the continued slow revolution during the non-measurement time enables clean air to be drawn into the shield cylinder 51 through a ventilating hole 60 to blow out the interior air, thereby preventing entry of dust such as toner or the like into the interior of the potentiometer.

While the present invention has been described with respect to various embodiments, the invention is not restricted thereto but various changes in design may be made without departing from the spirit and scope of the invention as defined in the appended claims.

What we claim is:

1. A surface potentiometer comprising:
   a conductive shield member mounted in proximity to a body to be measured and formed with an opening facing said body to be measured;
   a measuring electrode disposed within said shield member;
   cage-shaped interrupting means having a measuring window portion and an interrupting portion for intermittently interrupting the electric field between said body to be measured and said measuring electrode;
   rotative drive means for rapidly rotating said interrupting means to induce in said measuring electrode an AC voltage corresponding to the surface potential of the body to be measured; and
   detector means for detecting the relative position of said interrupting means and said opening, wherein said detector means detects the timing at which said interrupting means interrupts the electric field between said body to be measured and said measuring electrode.

2. A surface potentiometer comprising:
   a conductive shield member mounted in proximity to a body to be measured and formed with an opening facing said body to be measured;
   a measuring electrode disposed within said shield member;
   cage-shaped interrupting means having a measuring window portion and an interrupting portion for intermittently interrupting the electric field between said body to be measured and said measuring electrode, wherein said interrupting means is biased to a predetermined potential by the use of a slip ring or a brush; and
   rotative drive means for rapidly rotating said interrupting means to induce in said measuring electrode an AC voltage corresponding to the surface potential of the body to be measured.

3. A surface potentiometer comprising:
   a conductive shield member mounted in proximity to a body to be measured and formed with an opening facing said body to be measured;
   a measuring electrode disposed within said shield member;
   cage-shaped interrupting means mounted on a rotary shaft and having a measuring window portion and an interrupting portion for intermittently interrupting the electric field between said body to be measured and said measuring electrode; and
   rotative drive means for rapidly rotating said interrupting means to induce in said measuring electrode an AC voltage corresponding to the surface potential of the body to be measured, wherein a blade is provided on the rotary shaft of said interrupting means, and a ventilation hole is provided in said shield member, whereby entry of foreign materials into said shield member is prevented by rotation of said blade.

4. A surface potentiometer comprising:
   a conductive shield member mounted in proximity to a body to be measured and formed with an opening facing said body to be measured;
   a measuring electrode disposed within said shield member;
   cage-shaped interrupting means having a measuring window portion and an interrupting portion for intermittently interrupting the electric field between said body to be measured and said measuring electrode;
   rotative drive means for rapidly rotating said interrupting means to induce in said measuring electrode an AC voltage corresponding to the surface potential of the body to be measured; and
   detector means for detecting the relative position of said interrupting means and said opening, wherein said detector means comprises a light-emitting member and a light-receiving member.

5. A surface potentiometer according to claim 4, wherein said light-emitting member and said light-receiving member are mounted on said shield member.

6. A surface potentiometer according to claim 5, wherein said interrupting means is provided with an aperture for passing therethrough the light from said light-emitting member.

7. A surface potentiometer comprising:
   a measuring electrode mounted in proximity to a body to be measured;
   chopping means for intermittently interrupting the electric field between said body to be measured and said measuring electrode;
   rotating means for rotating said chopping means to detect the surface potential of said body to be measured as an AC signal;
   synchronizing signal generating means, comprising a light-emitting member and a light-receiving member, for detecting the timing at which said chopping means intermittently interrupts the electric field between said body to be measured and said measuring electrode and for generating a synchronizing signal; and
   discriminating means for discriminating between the positive and the negative of an AC signal induced in said measuring electrode by the use of said synchronizing signal and for providing the discriminating signal as the detection output.

8. A surface potentiometer comprising:
   a measuring electrode mounted in proximity to a body to be measured;
   chopping means for intermittently interrupting the electric field between said body to be measured and said measuring electrode;
   rotating means for rotating said chopping means to detect the surface potential of said body to be measured as an AC signal;
   synchronizing signal generating means, comprising a magnetic coupling member, for detecting the timing at which said chopping means intermittently interrupts the electric field between said body to be measured and said measuring electrode and for generating a synchronizing signal; and discriminating means for discriminating between the positive and the negative of an AC signal induced in said measuring electrode by the use of said synchronizing signal and for providing the discriminating signal as the detection output.

9. A surface potentiometer according to claim 8, wherein said magnetic coupling member comprises a magnet and a Hall element.

10. A surface potentiometer comprising:
a conductive shield member mounted in proximity to a body to be measured and formed with an opening facing said body to be measured;
a measuring electrode disposed within said shield member;
interrupting means having a measuring window portion and an interrupting portion for intermittently interrupting the electric field between said body to be measured and said measuring electrode;
drive means for rapidly driving said interrupting means to induce in said measuring electrode an AC voltage corresponding to the surface potential of the body to be measured; and
detector means for detecting the relative position of said interrupting means and said opening, wherein said detector means comprises a light-emitting member and a light-receiving member.

11. A surface potentiometer according to claim 10, wherein said light-emitting member and said light-receiving member are mounted on said shield member.

12. A surface potentiometer according to claim 10, wherein said interrupting means is provided with an aperture for passing therethrough the light from said light-emitting member.

13. A copying apparatus comprising:
image formation means for forming an electrostatic latent image on a rotating recording medium;
a conductive shield member mounted in proximity to said recording medium and formed with an opening facing said recording medium;
a potentiometer comprising:
a measuring electrode disposed within said shield member;
cage-shaped interrupting means including a plurality of measuring window portions each disposed equidistantly and having similar configurations, said interrupting means further including a shield portion for intermittently interrupting the electric field between said recording medium and said measuring electrode; and
rotative drive means for rapidly rotating said interrupting means to induce in said measuring electrode an AC voltage corresponding to the surface potential of said recording medium;
converter means for converting into a DC signal the AC signal induced in said measuring electrode; and
control means for controlling said image formation means in accordance with the output of said converter means.

14. A copying apparatus according to claim 13, wherein the rotational speed of said rotative drive means during the potential detection is higher than that during the non-potential detection.

* * * * *